(12) United States Patent
Buch

(10) Patent No.: US 6,253,361 B1
(45) Date of Patent: Jun. 26, 2001

(54) GENERALIZED THEORY OF LOGICAL EFFORT FOR LOOK-UP TABLE BASED DELAY MODELS USING CAPACITANCE RATIO

(75) Inventor: Premal Buch, Daly City, CA (US)

(73) Assignee: Magma Design Automation, Inc., Cupertino, CA (US)

( * ) Notice: Subject to any disclaimer, the term of this patent is extended or adjusted under 35 U.S.C. 154(b) by 0 days.

(21) Appl. No.: 09/295,938

(22) Filed: Apr. 21, 1999

(51) Int. Cl.[7] ........................................................ G06F 17/50

(52) U.S. Cl. ................................................................. 716/6

(58) Field of Search .................................................... 716/6

(56) References Cited

U.S. PATENT DOCUMENTS 5,459,673 * 10/1995 Carmean .................................. 716/6

* cited by examiner

Primary Examiner—Matthew Smith
Assistant Examiner—Thuan Do
(74) Attorney, Agent, or Firm—Blakely, Sokoloff, Taylor & Zafman LLP

(57) ABSTRACT

A method for designing a sequence of logic gates in a path is described. In one embodiment, the method includes modeling gate delay as a function of input slew and output load using a delay model and adjusting electrical efforts in each stage to reduce the gate delay along the path. In one embodiment, the electrical efforts in each stage are adjusted to minimize the delay along the path, where the delay along the path is minimized when a product of logical effort and electrical effort associated with each gate is the same.

25 Claims, 2 Drawing Sheets

GENERALIZED THEORY OF LOGICAL EFFORT FOR LOOK-UP TABLE BASED DELAY MODELS USING CAPACITANCE RATIO

FIELD OF THE INVENTION

The present invention relates to the field of integrated circuit (IC) chip design; more particularly, the present invention relates to managing gate delay due to interconnect and coupling capacitance for an IC chip design.

BACKGROUND OF THE INVENTION

Physical chip design has become a real challenge today. Now, more than ever, achieving timing convergence between physical design and logical design has become such an issue that EDA vendors, silicon vendors and end users alike are scrambling to obtain solutions that will at least allow them to get current designs into manufacturing.

In the past, the management of gate delay was the main concern to designers. Interconnect delay contributed such a small amount to the overall chip delay that it was either ignored or assumed to be negligible. Similarly, signal-integrity and quality issues such as crosstalk and electromigration were rarely a concern. Today, however, both chip performance and signal integrity are dictated by the interconnect topology. Even with copper interconnect and low-k dielectrics, interconnect contributes in excess of 45 percent of the total delay at 0.18 micron fabrication and below. With wires being taller, thinner and closer, coupling capacitance, a principle cause of crosstalk, is the dominant form of capacitance of which the designers must contend. No existing physical-design tools adequately address this issue.

Synthesis is usually the final step performed in front-end logic design. The output of synthesis is a gate-level net-list containing cells from the tool vendor's library chosen to meet the designer's functional and performance constraints. Cell selection and sizing are determined by using statistical wire-load models to "estimate" the actual interconnect loading that will exist in the physical layout. Those wire-load models are essentially random numbers that do not correlate well with the real delays due to interconnect and coupling capacitance. The actual interconnect load and resulting performance in the physical layout usually differ significantly from the prediction resulting from synthesis.

To solve the problem, some vendors are pushing RTL floor planning on the premise that predictions can be made early in the design process to provide better performance information than possible by doing full synthesis. One approach uses a concept of "logic effort" in an attempt to achieve an accurate estimate of the gate delay. The theory of logical effort represents the delay $D^{gate}$ through a simple logic gate, driving a capacitive load as:

$$D_{gate} = \tau(g_{gate} h_{gate} + p_{gate})$$

where $g_{gate}$ is the logical effort of the gate, $h_{gate}$ is the electrical effort of the gate, and $p_{gate}$ is the intrinsic delay of the gate. The Greek letter $\tau$ is a technology constant defined as the delay of an ideal inverter with no intrinsic delay, driving another ideal inverter.

The logical effort $g_{gate}$ represents the computational complexity of the gate and measures how much weaker it is in current drive compared to an ideal inverter with the same input capacitance. Logical effort compares the characteristic time constant (i.e., the product of the output resistance and input capacitance) of a gate with that of an inverter. Logical effort is a function of the topology of the transistor interconnections, but not of transistor sizes and is given by:

$$g_{gate} = \frac{R_{gate\_min} C_{gate\_min}}{R_{inv\_min} C_{inv\_min}}$$

where gate_min refers to the minimum sized gate and inv_min to the minimum sized inverter.

The electrical effort $h_{gate}$ is the ratio of the load capacitance to input capacitance and does depend on the transistor sizes. Electrical effort $h_{gate}$ is given by:

$$h_{gate} = \frac{C_{load}}{C_{in}}$$

where $C_{load}$ is the load capacitance of the gate in the given network, and $C_{in}$ the input capacitance.

The parasitic delay $p_{gate}$ occurs primarily due to source/drain diffusion capacitance $C_{diff\_min}$ at the output of the minimum sized gate. The parasitic delay depends on the layout geometry, but is independent of the sizes.

$$p_{gate} = \frac{R_{gate\_min} C_{diff\_min}}{R_{inv\_min} C_{inv\_min}}$$

For more information on logical effort, see I. E. Sutherland, R. F. Sproull, and D. Harris, "Logical Effort: Designing Fast CMOS Circuits," Morgan Kaufman Publishers, 1999.

Some other approaches to the problem include using parallel computing in an attempt to reduce the time required for each iteration in the design process. More processing power by itself is not likely to fix the problem. Therefore, designers do not have adequate tools available to them to try to obtain timing convergence.

SUMMARY OF THE INVENTION

A method for designing a sequence of logic gates in a path is described. In one embodiment, the method includes modeling gate delay as a function of input slew and output load using a delay model and adjusting electrical efforts in each stage to reduce the gate delay along the path. In one embodiment, the electrical efforts in each stage are adjusted to minimize the delay along the path, where the delay along the path is minimized when a product of the effective logical effort and electrical effort associated with each gate is the same.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
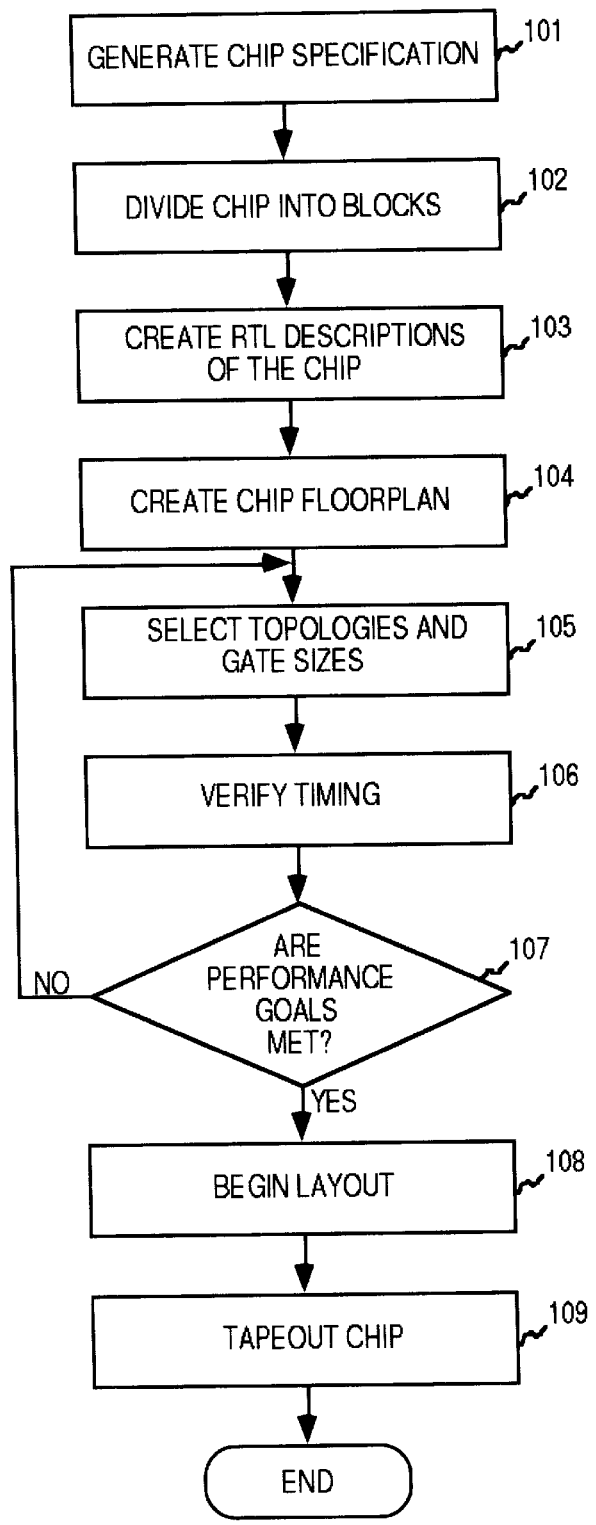
FIG. 1 is a flow diagram of one embodiment of a circuit design process.

A method and apparatus for designing a circuit is described. In the following description, numerous details are set forth, such as the number of stages, amount of capacitance, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Overview of the Design Process

A sequence of logic gates in a path may be designed by modeling gate delay as a function of input slew and output load using a delay model and adjusting electrical efforts in each stage to reduce the gate delay along the path. In one embodiment, the electrical efforts in each stage are adjusted to minimize the delay along the path, where the delay along the path is minimized when a product of the effective logical effort, as described below, and electrical effort associated with each gate is the same. These adjustments may be effectuated through cell selection and sizing. In one embodiment, the transistor sizes may be selected to obtain an electrical effort in a stage that achieves a predetermined delay for the path.

The modeling of the gate delay uses the effective logical effort, a more generalized version of logical effort, as discussed in more detail below.

Generalized Theory of Logical Effort

The circuit design process described herein uses a model to estimate the actual delay through a logic gate or sequence of logic gates. This model facilitates topology selection and gate sizing for an IC chip design. In one embodiment, a logic gate comprises a circuit that implements a logic function. These gates may be single stage gates, such as, for example, a NAND gate, or multi-stage gates, such as, for example, an AND-OR-INVERT gate.

In one embodiment, the model describes delays caused by the capacitive load that the logic gate drives, the topology of the logic gate and the input slew of the logic gate. That is, the delay of a logic gate is a function of input slew in addition to the output load. This additional dependency on input slew can be modeled by adding an extra term in a logical effort delay model. In one embodiment, the modified model is as follows:

$$d = \tau(gh + p + As)$$

$$s_{out} = \tau(B + Cs)$$

where g, h, and p are the logical effort, electrical effort and the parasitic delay, respectively, and _ is the technology constant, all of which are described in more detail below. Let s be the input slew to the gate and A, B, and C be arbitrary constants to model the slew dependency of the delay. The computation of A, B, and C from look-up table based delay model data that will be described in greater detail below. Additionally, let the effective logical effort for a gate be defined as $$g' = g + AC$$

The effective parasitic delay is given as follows:

$$p' = p + AB$$

In order to reduce, or even minimize, the path delay, all stages in the path must have an equal stage effort, where the stage effort is defined as the product of the logical and electrical efforts for the stage. The notion of effective logical effort can be used to derive results similar to the theory of logical effort while including the presence of slew dependency. In that sense, this formulation extends the theory of logical effort.

A More Detailed Design Flow

FIG. 1 is a flow diagram of an integrated circuit (IC) chip design process. Processing steps in the chip design process may be performed using processing logic. In one embodiment, the processing logic comprises hardware, software, or a combination of both.

Referring to FIG. 1, the design process begins by creating a specification for the chip. The specification defines the functionality and performance goals of the chip. In one embodiment, this specification is in a textual form. Next, the chip is partitioned into more manageable blocks to enable each of the blocks to be designed separately. This is not a requirement, but in many cases makes the design process simpler. For each of the blocks, register transfer level (RTL) descriptions are written in a language such as, for example, Verilog or VHDL. Once RTL descriptions have been created, an estimate of the size of each block is made and a floor plan is created depicting the relative placement of the blocks for the chip.

Given RTL and floor plan, selection of topologies and gate sizes is performed. As discussed herein, delay models are used as part of a systematic approach for topology selection and gate sizing as a way to determine if the specification is correct. After selection of topologies and gate sizes has been performed, timing verification determines whether the circuit meet the performance goals. If performance is inadequate, a circuit designer may modify the topology and/or the gate sizing to improve critical paths.

When the circuit design is complete, the chip may begin layout and eventually be taped out for manufacturing. Additional timing verification may be performed to ensure the design still meets timing goals after including more accurate capacitance and resistance data extracted from the layout.

Optimizing the Delay of a Two-Stage Path

Figure 2:
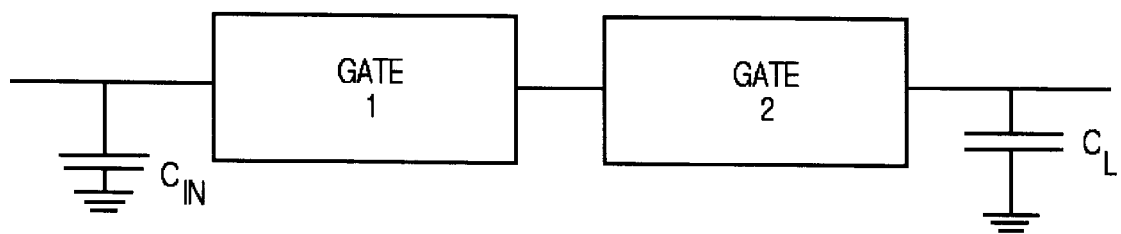
FIG. 2 illustrates a two-stage path.

For the case of a two stage path, let the path consist of two logic gates, numbered 1 and 2, which are connected in series. FIG. 2 illustrates a generic two-stage path. The input capacitance of the path, $C_1$, is the input capacitance of the first stage. Capacitance $C_L$ loads the second stage. The total delay D measured in units of $\tau$ is:

$$D=(g_1h_1+p_1+A_1s_0)+(g_2h_2+p_2+A_2s_1).$$

While the logical efforts, $g_1$ and $g_2$, and parasitic delays, $p_1$ and $p_2$, in the above equation are fixed, the electrical efforts in each stage can be adjusted to reduce or minimize the delay. The electrical efforts are constrained, however, by the input capacitance $C_1$ and the load capacitance $C_L$, which are fixed: $h_1=C_2/C_1$, $h_2=C_L/C_2 \Rightarrow h_1h_2=C_L/C_1=H$, where the path electrical effort, H, is a given constant that cannot be adjusted. Substituting $h_2=H/h_1$ yields:

$$D = (g_1h_1 + p_1 + A_1s_0) + \left(g_2\frac{H_2}{h_1} + p_2 + A_2(B_1 + C_1h_1)\right).$$

As shown below, to minimize the total delay D, a partial derivative is taken with respect to the variable $h_1$, the result of the partial derivative is set equal to zero, and the equation is solved for $h_1$:

$$\frac{\partial D}{\partial h_1} = g_1 + A_2C_1 - \frac{g_2H}{h_1^2} = 0 \Rightarrow (g_1 + A_2C_1)h_1 = g_2h_2$$

If the two gates are of the same type, then $g'_1h_1=g_2h_2$, where $g'_1=g_1+A_2C_1$. Thus, the total delay over the path is minimized when each stage bears the same effective stage effort, where the effective stage effort, as opposed to Sutherland's stage effort, is based on use of g. Notice that the delay of each stage does not have to be equal. In fact, unlike the theory of logical effort, the delays are not equal even if the parasitic delays are equal. However, for a logic gate driven by a gate of same type with the same electrical effort, the delay is given by $$D=gh+p+As=gh+p+A(B+Ch)=g'h+p'$$

Equal effective stage effort in this case translates to an equal variable part of the delay, i.e. the delays are the same if the effective parasitic delays are the same.

Optimizing the Delay of an N-Stage Path

To extend the use of equal effective stage efforts to optimize the delay of a generic path, consider a path of length N according to the theory of logical effort:

$$h_1h_2 \ldots h_n = BH$$

where the path electrical effort H is the ratio of the load on the last stage to the input capacitance of the first stage and the branching effort B is the product of the branching effort at each stage. Additionally, the logical effort, G, of the path from the theory of logical effort is given by:

$$g_1g_2 \ldots g_n = G.$$

Multiplying the two equations, the path effort F, is given by:

$$(g_1h_1)(g_2h_2) \ldots (g_nh_n) = GBH = F$$

i.e., $$(g'_0h_0)(g'_1h_2) \ldots (g'_{n-1}h_{n-1}) = F$$

where the subscript 0 denotes the parameters of the driver of this path. That is, the term $g'_0h_0$ represents a "virtual" gate (cell) that drive the path. Delay models are available for such virtual gates.

To obtain the minimum delay, the N factors on the left in the equation above must be equal so that each stage bears the same effective effort $f=g'h$. The equation may be rewritten as:

$$f^N = F$$

or $$f = F^{1/N}.$$

As in the case of a two-stage path, under certain assumptions about the driver, this can be interpreted as having equal variable delays.

Next, let $\underline{D}$ be the optimal path and $\underline{N}$ be the optimal number of stages for a path with given input and output capacitances.

$$D = \sum_{i=1}^{N} g_ih_i + p_i + A_is_{i-1}$$

$$= \sum_{i=1}^{N} g_ih_i + p_i + A_i(B_{i-1} + C_{i-1}h_{i-1})$$

$$= \sum_{i=1}^{N} g'_ih_i + p'_i + A_i(B_{i-1} + C_{i-1}h_{i-1})$$

Then, if all gates are of the same type, the minimum delay $\underline{D}$ is a function of the number of stages N and the effective effort per stage $F^{1/N}$ $$\underline{D} = NF^{1/N} + Np'_i + A_1s_0 - A_{N+1}C_Ns_N$$

Taking the derivitive of the minimum delay $\underline{D}$ with respect to the number of stages N and setting it equal to 0 results in the following:

$$\frac{\partial D}{\partial N} = F^{1/N} - F^{1/N}\ln F^{1/N} + p'_i = 0$$

If the solution to this equation is $\underline{N}$ and the optimal effective stage effort borne by each stage for this solution is set equal to $\rho'=F^{1/\underline{N}}$, then $$p'+\rho'(1-\ln\rho')=0$$

If p'=1, the optimal effective stage effort is 3.6, i.e., if the optimal effective electrical effort is $\underline{h}$, $$g'\underline{h}=(g+AC)\underline{h}=3.6.$$

Note that when delay is independent of slew (A=0), the above formula reduces to the optimal stage effort formula in the theory of logical effort.

In the generalization of the theory of logical effort, g' has the same significance as the quantity g in the theory of logical effort. The assumptions made in deriving the generalized theory of logical effort are more restrictive than the theory of logical effort due to the dependency introduced by slew modeling of a stage delay on its driver. From the analysis above, g'>g if A, C>0. Therefore, for an inverter, g'>1. This can be intuitively thought of as an inverter behaving more like a complex gate. The inverter is slower given the same input/output capacitances—this is to be expected since the delay formulation now has an extra slew-dependent contribution. Also, to achieve a target delay, the electrical effort has to be lower than before, or that logic gate has to be larger (higher input gate capacitance) than before. Again, this is to be expected since varying the electrical effort now changes only part of the delay.

The value of the optimal stage effort is higher (and consequently the number of stages lower) than using the logical effort without taking into account the contribution of slew. In practical terms, this amounts to having fewer, slower stages than before for the optimal delay scenario. This is to be expected since as the inverters are not as efficient as before, it is more costly to add inverter stages and hence more efficient to have fewer, slower stages.

Measuring the Model Parameters

The optimal effective stage effort is computed by measuring the variable delay of an ideally loaded inverter. From the theory of logical effort and the analysis above, the logical effort, g, of an inverter is 1 and $C_{out}=\underline{h}C_{in}=3.6C_{in}/(1+AC)$ for an optimally loaded inverter. Thus, the optimal effective stage effort is given by, $$\text{delay\_lookup}(3.6/(1+AC)C_{in},S_{in})-\text{delay\_lookup}(0,0)$$

for an inverter, where delay_lookup(c,s) is the delay of a gate evaluated from the corresponding lookup table for output load c and input slew s (which may comprise two axis of the table). The look-up table provides delay values based on the output load and input slew. Such look-up tables are well-known in the art and may be provided by vendors.

A, B, and C can be measured by simple numerical differential of the look-up table data with respect to the input slew. Performing simple numerical differential of look-up table data is well-known in the art. That is, the constant A is given by:

$$A = \frac{\delta(\text{delay})}{\delta(S_{in})}.$$

The constant B is given by $$B=s_{out}(c=0)$$

and the constant C is given by:

$$C = \frac{\delta(s_{out})}{\delta(s_{in})}.$$

Since the output slew, slews$_{out}$, equals B+Ch and h is 0 when there is no load on the gate ($C_{out}/C_{in}=0$, $C_{out}=0$), then B equals the slew out for a zero load.

Since the value of A and C depends on the operating point (in terms of load and input slew) at which the numerical differentiation is carried out, and the operating point depends on A, C and the input slew, there is a cyclic dependency between the computation of A, C and the computation of the operating point. This is resolved by iteratively solving for the slew until convergence. To determine the input slew, $S_{in}$, through an inverter, the slew may be measured iteratively, starting with zero input slew and A=C=0 to determine the operating point and using the computed output slew as the input slew to the same inverter in the next iteration. At each iteration, the values of A and C and the operating point are re-evaluated until the slew value converges.

Therefore, the look-up table allows obtaining the A and C values. Using the A and C values, the difference may be computed, thereby giving the optimal effective stage effort. Hence, by examining the timing of a gate, the optimal delay and effective logical effort may be obtained.

The process of determining the optimal delay is summarized as follows. First, the library is read and its data analyzed to obtain the values of A and C. Next, the ideal values for the effective logical effort and electrical effort are derived. Using these values, the optimal path with respect to delay may be identified as the path in which the product of the effective logical effort and the electrical effort for all the stages is the same, so that all the stages have the same variable delay. This variable delay then becomes the target to select cells so that each cell's variable delay is the same. With the variable delay of each cell known, the size of each cell may be selected. In other words, the gate level net lists containing cells from libraries may be created and/or modified by selecting cell sizes to obtain the target delay.

Note that the processing described herein can be performed with hardware, software, or a combination of both.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A method for designing a sequence of logic gates in a path, the method comprising:

modeling gate delay as a function of input slew and output load using a delay model; and adjusting electrical efforts in each stage to reduce the gate delay along the path.

2. The method defined in claim 1 wherein adjusting electrical efforts in each stage to reduce the delay along the path comprises adjusting electrical efforts in each stage to minimize the delay along the path.

3. The method defined in claim 2 wherein the delay along the path is minimized when a product of effective logical effort and electrical effort associated with each gate within the sequence of logic gates is the same as the corresponding product of each gate within the sequence of gates.

4. The method defined in claim 1 wherein modeling gate delay comprises fixing logical efforts and parasitic delays associated with the logic gates in the path.

5. The method defined in claim 1 further comprising selecting gate sizes to obtain an electrical effort in each stage that achieves a predetermined delay for the path.

6. The method defined in claim 1 further comprising selecting transistor sizes to obtain an electrical effort in each stage that achieves a predetermined delay for the path.

7. A method for designing a sequence of logic gates in a path, the method comprising:

modeling gate delay as a function of input slew and output load;

determining when a product of effective logic effort and electrical effort associated with each gate in the system is equal to the corresponding product of each gate within the sequence of gates; and using a variable delay of the gates as the optimal gate delay.

8. The method defined in claim 7 where in the path including at least one stage further comprising adjusting electrical efforts in each stage to reduce the delay along the path.

9. The method defined in claim 8 where the path including at least one stage further comprising adjusting electrical efforts in each stage to minimize the delay along the path, wherein the delay along the path is minimized when a product of effective logical effort and electrical effort associated with each gate is the same.

10. The method defined in claim 7 where in the path including at least one stage wherein modeling gate delay comprises fixing logical efforts and parasitic delays associated with the logic gates in the path.

11. The method defined in claim 7 where in the path including at least one stage further comprising selecting gate sizes to obtain an electrical effort in each stage that achieves a predetermined delay for the path.

12. The method defined in claim 7 where in the path including at least one stage further comprising selecting transistor sizes to obtain an electrical effort in each stage that achieves a predetermined delay for the path.

13. An apparatus for designing a sequence of logic gates in a path, the apparatus comprising:

means for modeling gate delay as a function of input slew and output load using a delay model; and means for adjusting electrical efforts in each stage to reduce the gate delay along the path.

14. The apparatus defined in claim 13 wherein the means for adjusting electrical efforts in each stage to reduce the delay along the path comprises means for adjusting electrical efforts in each stage to minimize the delay along the path.

15. The apparatus defined in claim 14 wherein the delay along the path is minimized when a product of effective logical effort and electrical effort associated with each gate within the sequence of logic gates is the same as the corresponding product of each gate within the sequence of gates.

16. The apparatus defined in claim 13 wherein the means for modeling gate delay comprises means for fixing logical efforts and parasitic delays associated with the logic gates in the path.

17. The apparatus defined in claim 13 further comprising means for selecting gate sizes to obtain an electrical effort in each stage that achieves a predetermined delay for the path.

18. The apparatus defined in claim 13 further comprising means for selecting transistor sizes to obtain an electrical effort in each stage that achieves a predetermined delay for the path.

19. An apparatus for designing a sequence of logic gates in a path, the apparatus comprising:

means for modeling gate delay as a function of input slew and output load;

means for determining when a product of the effective logic effort and electrical effort associated with each gate in the system is equal to the corresponding product of each gate within the sequence of gates; and means for using a variable delay of the gates as the optimal gate delay.

20. The apparatus defined in claim 19 where in the path including at least one stage further comprising means for adjusting electrical efforts in each stage to reduce the delay along the path.

21. The apparatus defined in claim 20 where in the path including at least one stage further comprising means for adjusting electrical efforts in each stage to minimize the delay along the path, wherein the delay along the path is minimized when a product of effective logical effort and electrical effort associated with each gate is the same.

22. The apparatus defined in claim 19 wherein the means for modeling gate delay comprises means for fixing logical efforts and parasitic delays associated with the logic gates in the path.

23. The method defined in claim 19 where in the path including at least one stage further comprising means for selecting gate sizes to obtain an electrical effort in each stage that achieves a predetermined delay for the path.

24. The apparatus defined in claim 19 where in the path including at least one stage further comprising means for selecting transistor sizes to obtain an electrical effort in each stage at achieves a predetermined delay for the path.

25. An article of manufacture for use in designing a sequence of logic gates in a path having at least one stage, the article of manufacture having one or more recordable media with executable instructions stored thereon which, when executed by a processing device, cause the processing device to:

model gate delay as a function of input slew and output load using a delay model; and adjust electrical efforts in each stage to reduce the gate delay along the path.

* * * * *